United States Patent
Lee et al.

(10) Patent No.: US 9,564,209 B1
(45) Date of Patent: Feb. 7, 2017

(54) NON-VOLATILE STATIC RANDOM ACCESS MEMORY USING A 7T1R CELL WITH INITIALIZATION AND PULSE OVERWRITE

(71) Applicant: NATIONAL TSING HUA UNIVERSITY, Hsinchu (TW)

(72) Inventors: Albert Lee, New Taipei (TW); Chien-Chen Lin, Hsinchu (TW); Chieh-Pu Lo, Taipei (TW); Meng-Fan Chang, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 14/860,763

(22) Filed: Sep. 22, 2015

(51) Int. Cl.
*G11C 11/413* (2006.01)
*G11C 14/00* (2006.01)
*G11C 13/00* (2006.01)
*G11C 11/419* (2006.01)

(52) U.S. Cl.
CPC .......... *G11C 11/413* (2013.01); *G11C 11/419* (2013.01); *G11C 13/0069* (2013.01); *G11C 14/009* (2013.01); *G11C 14/0054* (2013.01); *G11C 14/0081* (2013.01)

(58) Field of Classification Search
CPC . G11C 14/009; G11C 11/419; G11C 13/0069; G11C 11/413; G11C 14/0054; G11C 14/0081
See application file for complete search history.

(56) References Cited

U.S. PATENT DOCUMENTS

| | | | | |
|---|---|---|---|---|
| 2010/0080042 A1* | 4/2010 | Lamorey | ............ | G11C 14/0081 365/148 |
| 2011/0280073 A1* | 11/2011 | Chiu | .................. | G11C 13/0002 365/185.08 |
| 2012/0281457 A1* | 11/2012 | Behrends | .............. | G11C 11/413 365/154 |
| 2012/0320658 A1* | 12/2012 | Wang | ................. | G11C 14/0054 365/148 |
| 2013/0135918 A1* | 5/2013 | Kushida | ............. | G11C 13/0069 365/145 |

* cited by examiner

*Primary Examiner* — J. H. Hur
*Assistant Examiner* — Ajay Ojha
(74) *Attorney, Agent, or Firm* — Li & Cai Intellectual Property (USA) Office

(57) ABSTRACT

A non-volatile SRAM cell comprises a first inverter, a second inverter, a first access transistor, a second access transistor, and a variable resistive element. The first inverter voltage is supplied by a first differential supply. The second inverter voltage is supplied by a second differential supply. The variable resistive element coupling with a third access transistor in series is coupled to the first output node. The non-volatile SRAM cell operates in a restore operation comprising a dual supply initialization phase and a pulse-overwrite phase. During the dual supply initialization phase, the first differential supply increases before the second differential supply so as to initialize the first output node to a logic state. During the pulse-overwrite phase, the third access transistor is turned on for a switch period in order to discharge/charge the first output node.

8 Claims, 9 Drawing Sheets

NON-VOLATILE STATIC RANDOM ACCESS MEMORY USING A 7T1R CELL WITH INITIALIZATION AND PULSE OVERWRITE

BACKGROUND OF THE INVENTION

1. Field of the Invention

The instant disclosure relates to a static random access memory cell; in particular, to a non-volatile static random access memory using a 7T1R cell with initialization and pulse overwrite.

2. Description of Related Art

In order to reduce required power consumption, minimizing the size of the integrated circuit memory devices in semiconductors is still the direction to strive for. Memory devices in semiconductors include static random access memory (SRAM) and dynamic random access memory (DRAM). A DRAM memory cell only has one transistor and a capacitor, which provides high integrability. However, since DRAM required refresh operation, high power consumption and slow speed makes DRAM a memory choice limited to mostly computer memories. On the other hand, SRAM cell has bistability, which means with the appropriate power, SRAM can continuously maintain the original state. SRAM can operate in high speed under low power consumption, such that computers mostly use a lot of cache SRAM. Other applications include embedded memory, and network device memory.

Conventional structures of common SRAM cells include six transistors (6T). Please refer to FIG. 1 as a circuit diagram of a conventional 6T static random access memory cell. The conventional 6T static random access memory cell 1 includes a first inverter 11, a second inverter 12, a first access transistor M5, and a second access transistor M6. The first inverter 11 includes a first pull-up transistor M1 and a first pull-down transistor M3, whereas the second inverter 12 includes a second pull-up transistor M2 and a second pull-down transistor M4. The first pull-up transistor M1 has a source terminal and the second pull-up transistor M2 has a source terminal cooperatively coupled to a voltage supply $V_{DD}$. The first pull-down transistor M3 has a source terminal and the second pull-down transistor M4 has a source terminal cooperatively coupled to a low voltage supply $V_{SS}$. The first pull-down transistor M3 has a drain terminal and the first pull-up transistor M1 has a drain terminal cooperatively coupled to form a first output node Q of the first inverter 11. The second pull-down transistor M4 has a drain terminal and the second pull-up transistor M2 has a drain terminal cooperatively coupled to form a second output node QB of the second inverter 12.

The first access transistor M5 has a gate terminal coupled to a word line WL, a source terminal coupled to the first output node Q, and a drain terminal coupled to a first bit line BL. The second access transistor M6 has a gate terminal coupled to the word line WL, a source terminal coupled to the second output node QB, and a drain terminal coupled to a second bit line BLB.

Please refer to FIGS. 1 and 2. FIG. 2 is a signal diagram of the conventional 6T static random access memory cell while data are being written thereon. Conventional 6T static random access memory cell 1 must fix the first bit line BL and the second bit line BLB to a group of fixed voltage when data are being written, such that data stored in the first output node Q and the second output node QB are forced to flip.

Please refer to FIGS. 1 and 3. FIG. 3 is a signal diagram of the conventional 6T static random access memory cell while data are being read therefrom. Conventional 6T static random access memory cell 1 must pull the electric potential of word line WL to "1" (refer to the T3-T4 interval as shown in FIG. 3) when data is being read, which is different from writing, the electric potential of the first bit line BL must pull up and be equal to the second bit line BLB before the electric potential of the word line WL pulls up to "1", and the first bit line BL and the second bit line BLB must have equal electric potentials such as "1" as shown in FIG. 3. When the first bit line BL is equal to the second bit line BLB and floating, the word line WL then provides on signals. The conventional 6T static random access memory cell uses the storage values of the first output node Q and the second output node QB and, via the first access transistor M5 and the second access transistor M6, generates charge sharing and voltage division respectively with the first bit line BL and the second bit line BLB, such that difference in electric potential is induced between the first bit line BL and the second bit line BLB. As shown in FIG. 3, the electric potential signal of the first bit line BL is affected, thus voltage is reduced. Successively, an external signal amplifier (not shown in the figures) amplifies differences in signals and reads out the voltage value as "0" or "1".

Furthermore, non-volatile SRAM stores data in a non-volatile element. The stored data still remains when the power supply is turned off. Usually, the non-volatile element can be a resistive storage device, such as phase change material (PCM), magnetic tunnel junction (MTJ), or memristor etc. which have been utilized in the phase change random-access memory (PCRAM), the resistive random-access memory (RRAM) or the magnetoresistive random-access memory (MRAM). Then non-volatile SRAM can completely eliminate SRAM leakage during standby.

SUMMARY OF THE INVENTION

The object of the instant disclosure is to provide non-volatile static random access memory using a 7T1R cell with initialization and pulse overwrite.

In order to achieve the aforementioned objects, according to an embodiment of the instant disclosure, a non-volatile static random access memory cell is provided. The non-volatile static random access memory cell comprises a first inverter, a second inverter, a first access transistor, a second access transistor, and a variable resistive element. The first inverter has a first input node and a first output node. The first inverter is voltage supplied by a first differential supply. The second inverter has a second input node and a second output node. The second inverter is voltage supplied by a second differential supply, wherein the first input node is coupled to the second output node, the second input node is coupled to the first output node. The first access transistor has a gate terminal coupled to a first word line. The first access transistor has a source terminal coupled to the first output node. The second access transistor has a gate terminal coupled to the first word line. The second access transistor has a source terminal coupled to the second output node. The variable resistive element coupling with a third access transistor in series is coupled to the first output node. The non-volatile static random access memory cell operates in a restore operation comprising a dual supply initialization phase and a pulse-overwrite phase. During the dual supply initialization phase, the first output node is initialized as a logic state ("1" or "0"). During the pulse-overwrite phase, the third access transistor is turned on for a switch period in order to discharge/charge the first output node.

In summary, the provided 7T1R non-volatile static random access memory cell can reduce store power, increase restore yield, and improve write-margin in SRAM-mode. Furthermore, the provided 7T1R non-volatile SRAM cell can also save energy and save circuit area compared to previous works of the non-volatile SRAM.

In order to further the understanding regarding the instant disclosure, the following embodiments are provided along with illustrations to facilitate the disclosure of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 1:
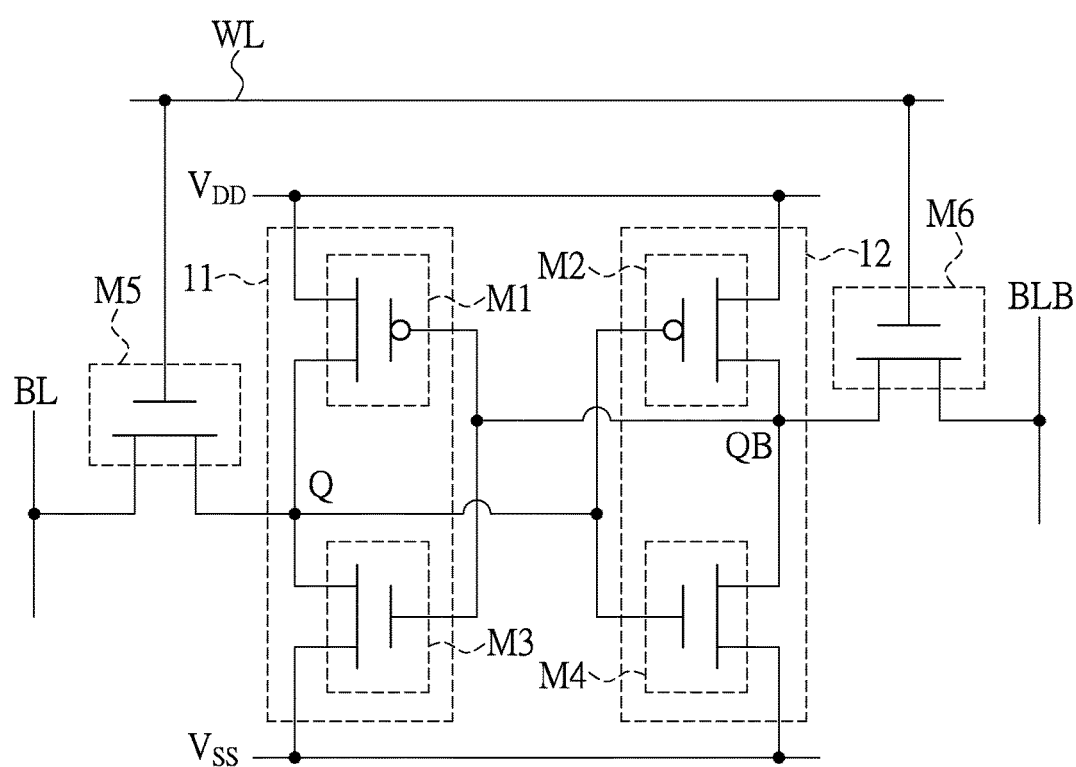
FIG. 1 is a circuit diagram of a conventional 6T static random access memory cell.
Figure 2:
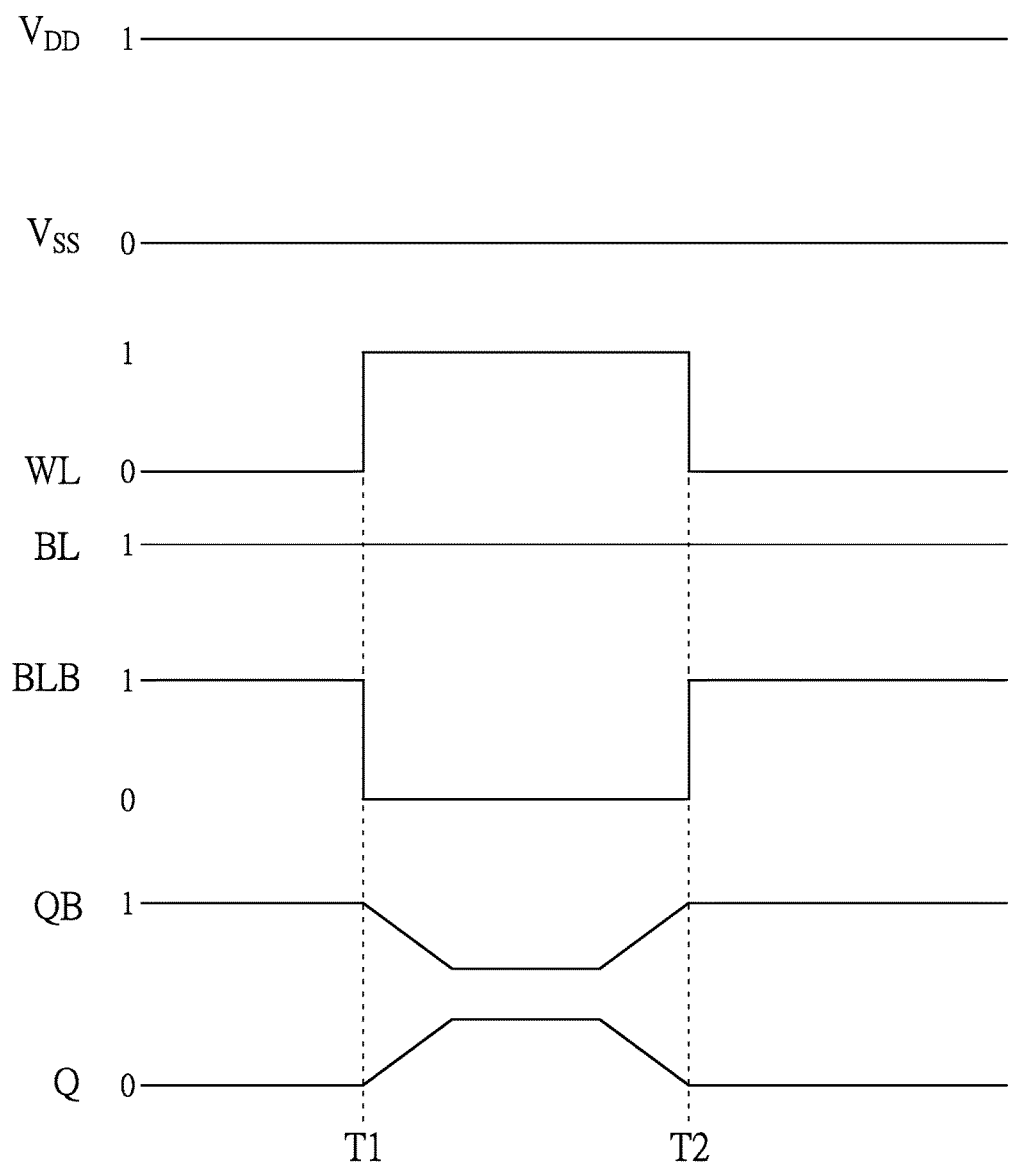
FIG. 2 is a signal diagram of the conventional 6T static random access memory cell during the write operation, in which BL and BLB do not precharge until WL is turned off, and the cell should not switch back.
Figure 3:
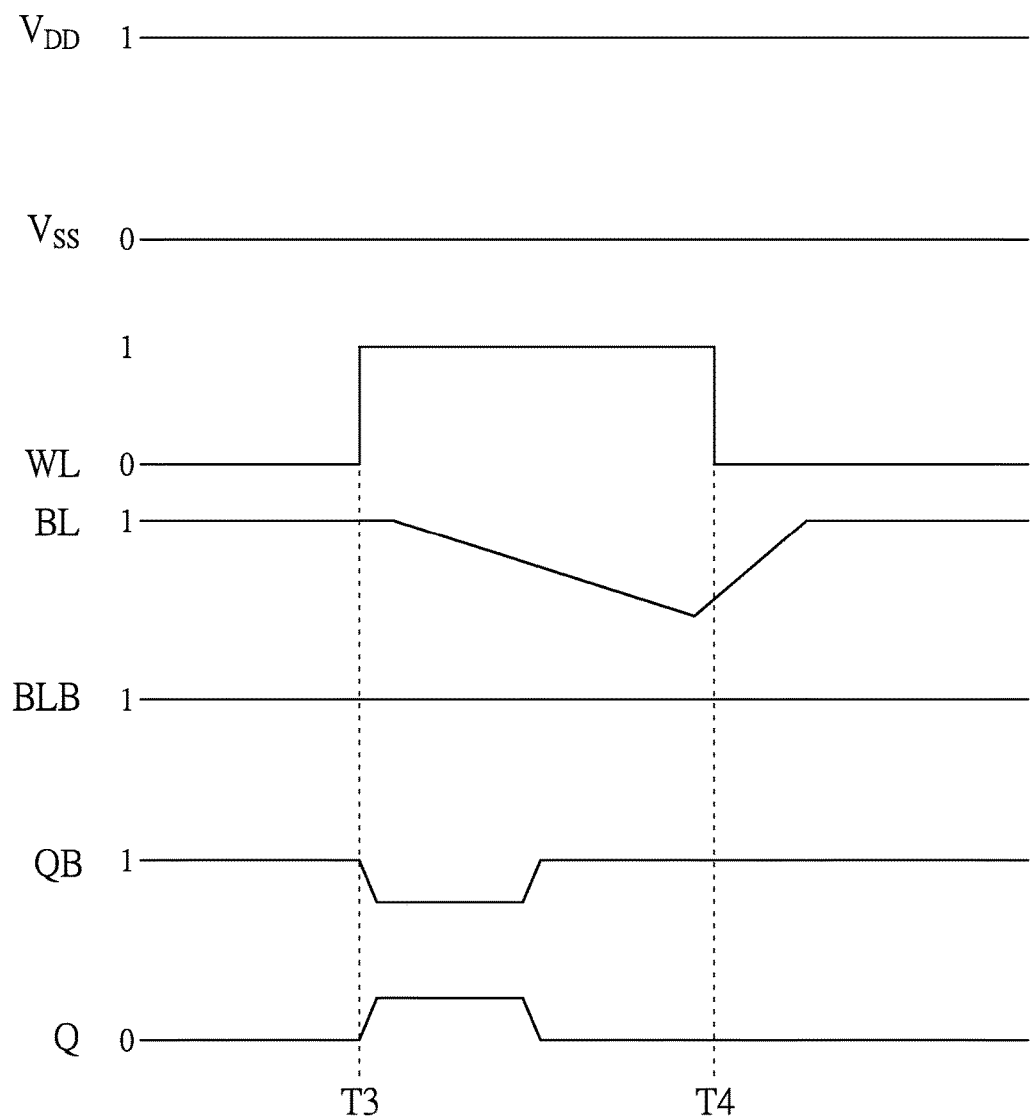
FIG. 3 is a signal diagram of the conventional 6T static random access memory cell during the read operation, in which BL should not precharge until WL is turned off, QB does not experience a voltage drop, Q should have voltage bump until WL is turned off.
Figure 4:
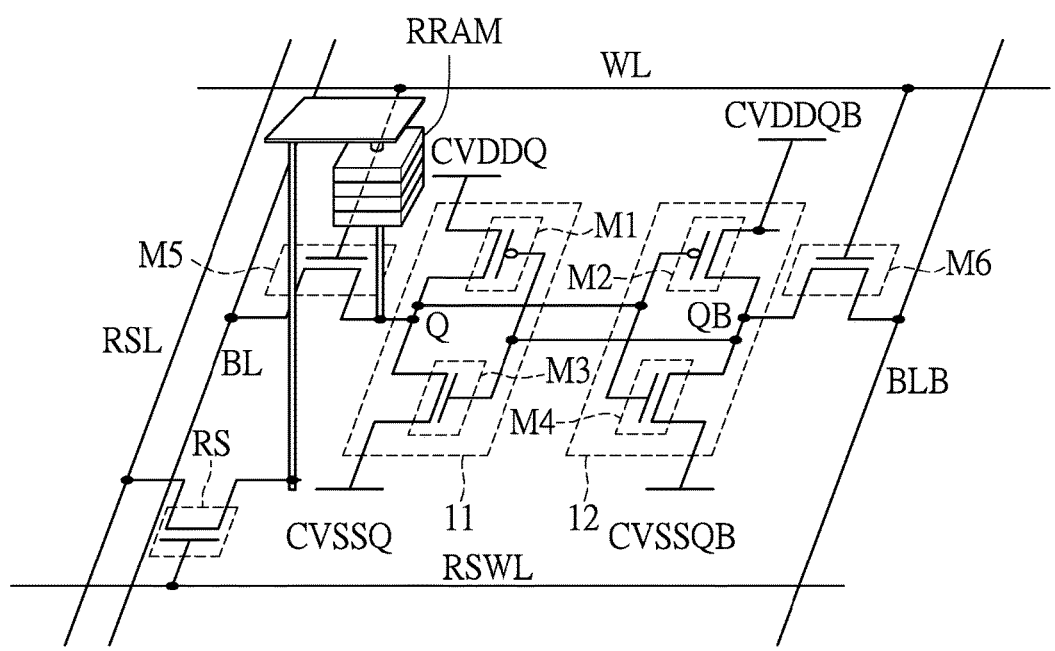
FIG. 4 shows a circuit diagram of a 7T1R non-volatile static random access memory cell according to an embodiment of the instant disclosure.

Please refer to FIG. 4 showing a circuit diagram of a 7T1R non-volatile static random access memory (SRAM) cell according to an embodiment of the instant disclosure. The 7T1R non-volatile SRAM cell comprises a first inverter 11, a second inverter 12, a first access transistor M5, a second access transistor M6, and a variable resistive element RRAM.

The first inverter 11 comprises a first pull-up transistor M1 and a first pull-down transistor M3. The first pull-up transistor M1 has a source terminal coupled to a first high voltage CVDDQ. The first pull-down transistor M3 has a source terminal coupled to a first low voltage CVSSQ (which is a ground voltage in FIG. 4). The first pull-down transistor M3 has a drain terminal coupled to a drain terminal of the first pull-up transistor M1 to form a first output node Q. A first input node of the first inverter 11 is a node connecting a gate terminal of the first pull-up transistor M1 and a gate terminal of the first pull-down transistor M3. The first inverter 11 is voltage supplied by a first differential supply, wherein the voltage difference between the first high voltage CVDDQ and the first low voltage CVSSQ (which is the ground voltage in FIG. 4) is the first differential supply.

The second inverter has a second pull-up transistor M2 and a second pull-down transistor M4. The second pull-up transistor M2 has a source terminal coupled to a second high supply voltage CVDDQB. The second pull-down transistor M4 has a source terminal coupled to a second low voltage CVSSQB (which is the ground voltage in FIG. 4). The second pull-down transistor M4 has a drain terminal coupled to a drain terminal of the second pull-up transistor M2 to form the second output node QB. A second input node of the second inverter 12 is a node connecting a gate terminal of the second pull-up transistor M2 and a gate terminal of the second pull-down transistor M4. The second inverter 12 is voltage supplied by a second differential supply, wherein the voltage difference between the second high voltage CVDDQB and the second low voltage CVSSQB (which is the ground voltage in FIG. 4) is the second differential supply.

The first input node is coupled to the second output node QB, the second input node is coupled to the first output node Q. The first access transistor M5 has a gate terminal coupled to a first word line WL. The first access transistor M5 has a source terminal coupled to the first output node Q. The second access transistor M6 has a gate terminal coupled to the first word line WL. The second access transistor M6 has a source terminal coupled to the second output node QB. In short, the first inverter 11, the second inverter 12, the first access transistor M5 and the second access transistor M6 forms a conventional 6T SRAM cell. However, a variable resistive element RRAM coupling with a third access transistor RS in series is added, wherein the variable resistive element RRAM coupling with a third access transistor RS in series is coupled to the first output node Q. Also, differential supplies and a novel operation of the 7T1R SRAM cell is provided. In the embodiment shown in FIG. 4, the variable resistive element RRAM coupling with the third access transistor RS is coupled between the first output node Q and a set line RSL. In another embodiment shown in FIG. 7, the variable resistive element RRAM coupling with the third access transistor RS is coupled between the first output node Q and the second output node QB.

The operation of the 7T1R SRAM cell of FIG. 4 is described as follows. The 7T1R SRAM cell operates in a store operation for inputting the logic value stored in the volatile 6T SRAM cell to the variable resistive element RRAM. The 7T1R SRAM cell also operates in a restore operation for inputting the logic value stored in the variable resistive element RRAM to the volatile 6T SRAM cell.

Figure 5:
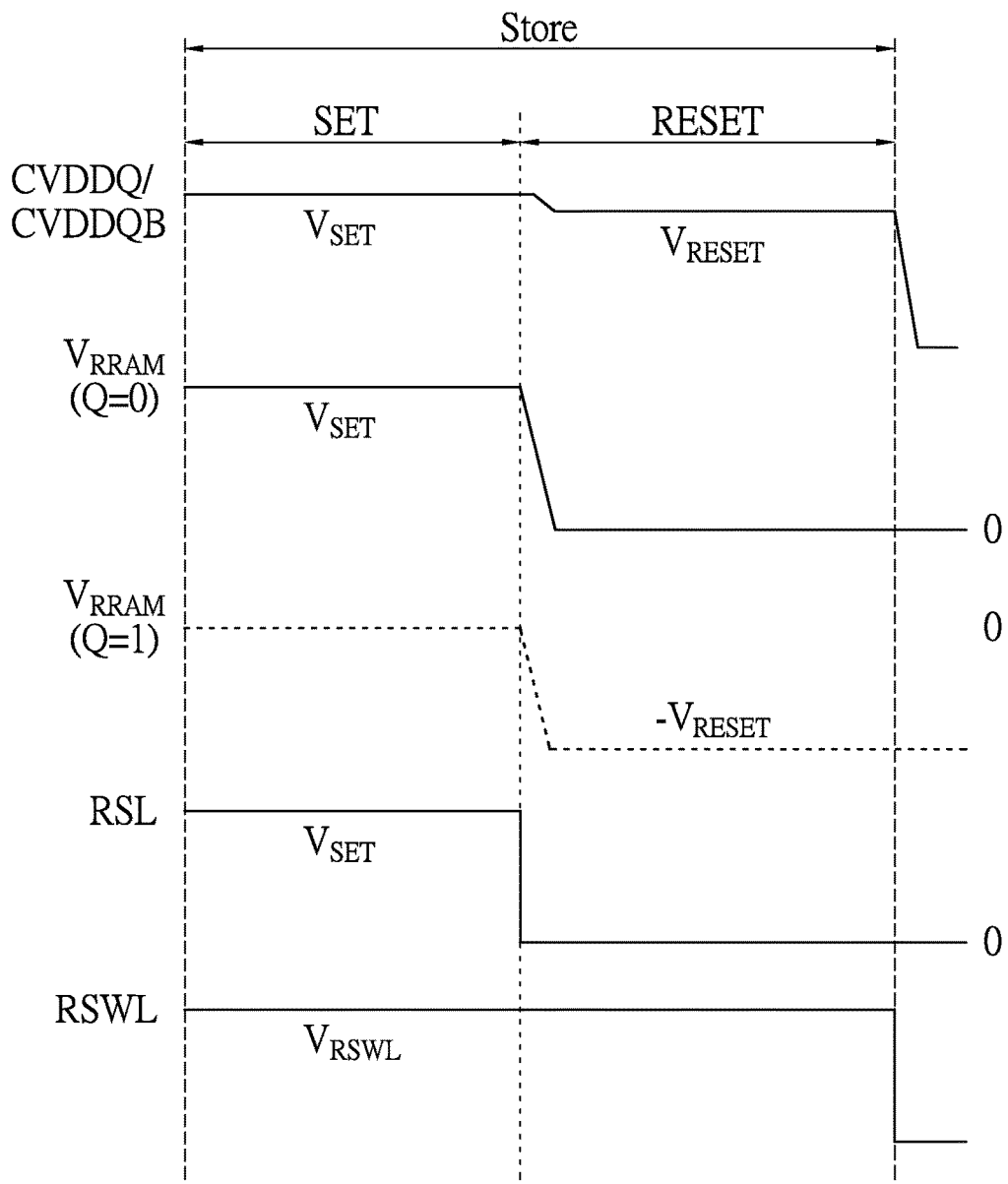
FIG. 5 shows a signal diagram of a store operation of the 7T1R non-volatile static random access memory cell shown in FIG. 4.

For the store operation of the 7T1R SRAM cell shown in FIG. 4, please refer to FIG. 5 showing a signal diagram of a store operation of the 7T1R SRAM cell shown in FIG. 4. During the store operation, the third access transistor RS is turned on by a voltage $V_{RSWL}$ of the second word line RSWL, wherein a gate terminal of the third access transistor RS is coupled to the second word line RSWL. The store operation comprising a set phase and a reset phase can be performed in two clock cycles. The set phase is followed by the reset phase. During the set phase the set line RSL is at a setting voltage $V_{SET}$. The high supply voltage CVDDQ and the second high supply voltage CVDDQB are both at a setting voltage $V_{SET}$. When the logic value of the first output node Q is "0", the variable resistive element RRAM is set to a low resistance state (LRS). However, when the logic value of the first output node Q is "1", there is no operation for the the variable resistive element RRAM because that the voltage difference between the setting voltage $V_{SET}$ and the first output node Q is about zero volts or significiantally small, such that voltage difference between two terminals of the variable resistive element RRAM is not large enough to change the state of the variable resistive element RRAM.

During the reset phase, the set line RSL is at a low voltage level (the ground voltage, referring to FIG. 5). The high supply voltage CVDDQ and the second high supply voltage CVDDQB are both at a resetting voltage $V_{RESET}$. When the logic value of the first output node is "1", the voltage across the variable resistive element RRAM is $-V_{RESET}$, then the variable resistive element RRAM is set to a high resistance state (HRS). However, when the logic value of the first output node is "0" (the ground voltage, referring to FIG. 5), there is no operation for the variable resistive element RRAM because there is no significant voltage difference between two terminals of the variable resistive element RRAM.

Figure 6:
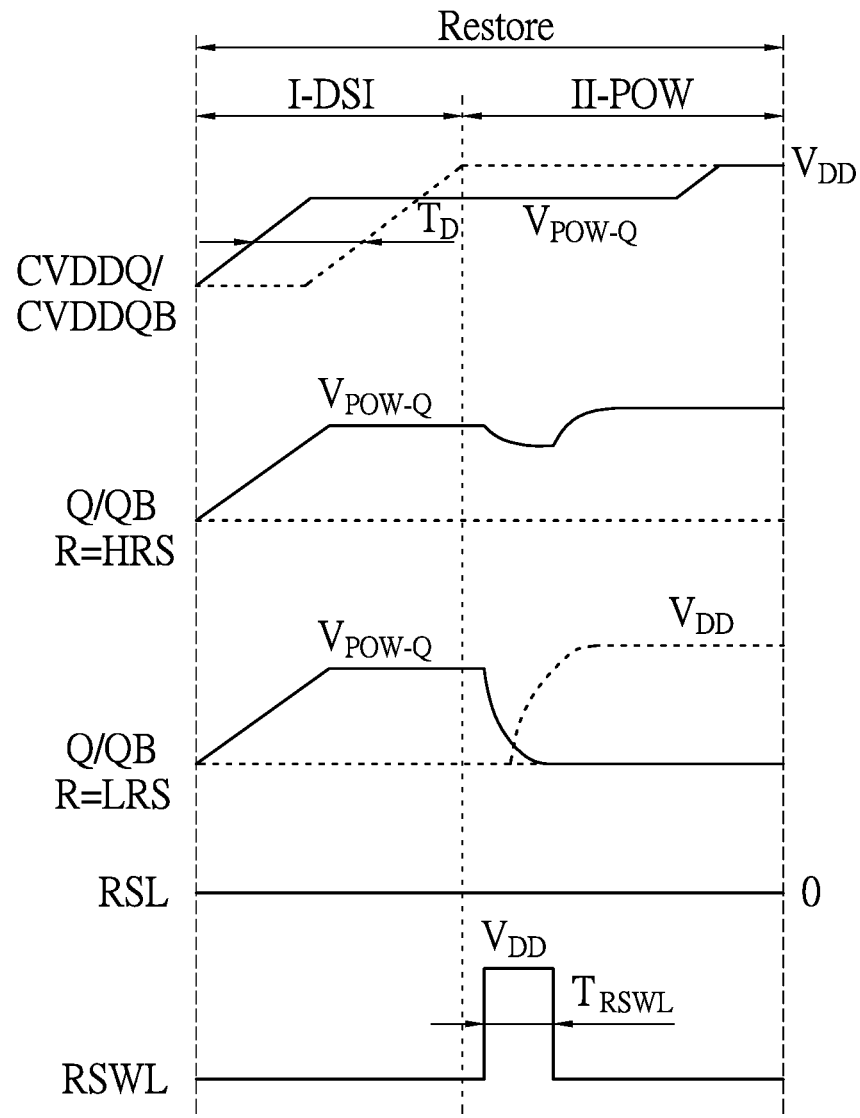
FIG. 6 shows a signal diagram of a restore operation of the 7T1R non-volatile static random access memory cell shown in FIG. 4.

For the restore operation, referring to FIG. 6, the restore operation comprises a first phase and a second phase. The first phase is a dual supply initialization (DSI) phase. The second phase is a pulse-overwrite (POW) phase. During the dual supply initialization phase, the first output node Q is initialized as a logic state ("1" or "0"). In the embodiment of FIG. 4, the first output node Q is initialized as logic "1", that is the volatile SRAM is initialized to logic "1". The first high voltage CVDDQ raises (from the ground voltage) before the second high voltage CVDDQB, while the first low voltage CVSSQ is the same as the second low voltage CVSSQB (which is the ground voltage). As shown in FIG. 6, during the dual supply initialization phase, the first high voltage CVDDQ raises while the second high voltage CVDDQB is kept low, in order to initialize the first output node Q to be high logic state ("1"). Then, after a time dealy $T_D$, the second high voltage CVDDQB is raised. Thus, the first output node Q stays at logic "1" and the second output node QB is at logic "0". Therefore, the volatile SRAM is initialized to logic "1". As shown in FIG. 6, at the end of the dual supply initialization (DSI) phase the voltage of the first output node Q is at $V_{POW-Q}$, and the voltage of the second output node QB is at the ground voltage.

Then, during the pulse-overwrite (POW) phase, the third access transistor RS is turned on for a switch period $T_{RSWL}$ in order to discharge the first output node Q. Because the set line RSL is set to low voltage level (ground voltage), a current can flow from the first output node Q to the set line RSL. The amount of the current depends of the state of the variable resistive element RRAM. During the pulse-overwrite phase, the first high voltage CVDD and the second high voltage CVDDQB can be the same. Alternatively, as shown in FIG. 6, the second high voltage CVDDQB is higher than the first high voltage CVDDQ during the switch period $T_{RSWL}$. The voltage difference between the second high voltage CVDDQB and the first high voltage CVDDQ is used to overcome the latch state of these two inverters 11, 12 if the resistance of the variable resistive element RRAM is too large. When the third access transistor RS is turned on, if the variable resistive element RRAM is at the high resistance state (HRS) the first output node Q is maintained at logic value "1" ($V_{DD}$), while the second output node QB is maintained at logic value "0" (ground voltage). A little voltage drop of the first output node Q can be seen in FIG. 5 due to a small amount of discharge to the variable resistive element RRAM with large resistance. Otherwise, if the variable resistive element RRAM is at the low resistance state (LRS) the first output node Q is discharged to logic value "0" (ground voltage), while the second output node QB is changed to logic value "1" (VDD).

In another embodiment, the first output node can be initialized as logic "0" during the dual supply initialization phase (DSI). For initializing the first output node Q as logic "0" (the volatile SRAM is initialized to logic "0"), the first high voltage CVDDQ raises after the second high voltage CVDDQB while the first low voltage CVSSQ is the same as the second low voltage CVSSQB. Then, during the pulse-overwrite phase (POW) the set line RSL is set to high voltage level. When the third access transistor RS is turned on, a current can flow from the set line RSL to the first output node Q in order to charge the first output node Q. If the variable resistive element RRAM is at the high resistance state (HRS) the first output node Q is maintained at logic value "0", while the second output node QB is maintained at logic value "1". Otherwise, if the variable resistive element RRAM is at the low resistance state (LRS) the first output node Q is charged to logic value "1", while the second output node QB is changed to logic value "0".

Furthermore, based on the 7T1R SRAM cell of FIG. 4, because the differential supplies can be controlled by high-side nodes (the first high voltage CVDDQ and the second high voltage CVDDQ) or low-side nodes (the first low voltage VSSQ and the second low voltage VSSQB), another type of differential supplies using the same mechanism will be described as follows. At the beginning of the dual supply initialization phase, the first high voltage CVDDQ, the second high voltage CVDDQB, the first low voltage VSSQ, and the second low voltage VSSQB are at the same high voltage ($V_{DD}$). During the dual supply initialization phase, for initializing the first output node Q as logic "1", the second low voltage CVSSQB is pull-down to the ground voltage before the first low voltage CVSSQ is pull-down to the ground voltage. Then, in the pulse-overwrite phase, the set line RSL is at low voltage (the ground voltage, for example), the first output node Q is discharged by the path from the variable resistive element RRAM to the set line RSL based on the state of the variable resistive element RRAM. When the variable resistive element RRAM is at the high resistance state (HRS), the logic value of the first output node Q would be maintained at logic "1". When the the variable resistive element RRAM is at the low resistance state (LRS), the logic value of the first output node Q would be changed to logic "0". In another embodiment, for initializing the first output node Q as logic "0" (the volatile SRAM is initialized to logic "0"), the second low voltage CVSSQB is pull-down to the ground voltage after the first low voltage CVSSQ is pull-down to the ground voltage. Then, in the pulse-overwrite phase, the set line RSL is at high voltage ($V_{DD}$), the first output node Q is charged by the path from the set line RSL to the variable resistive element RRAM based on the state of the variable resistive element RRAM. When the the variable resistive element RRAM is at the high resistance state (HRS), the logic value of the first output node Q would be maintained at logic "0". When the the variable resistive element RRAM is at the low resistance state (LRS), the logic value of the first output node Q would be changed to logic "1".

Figure 7:
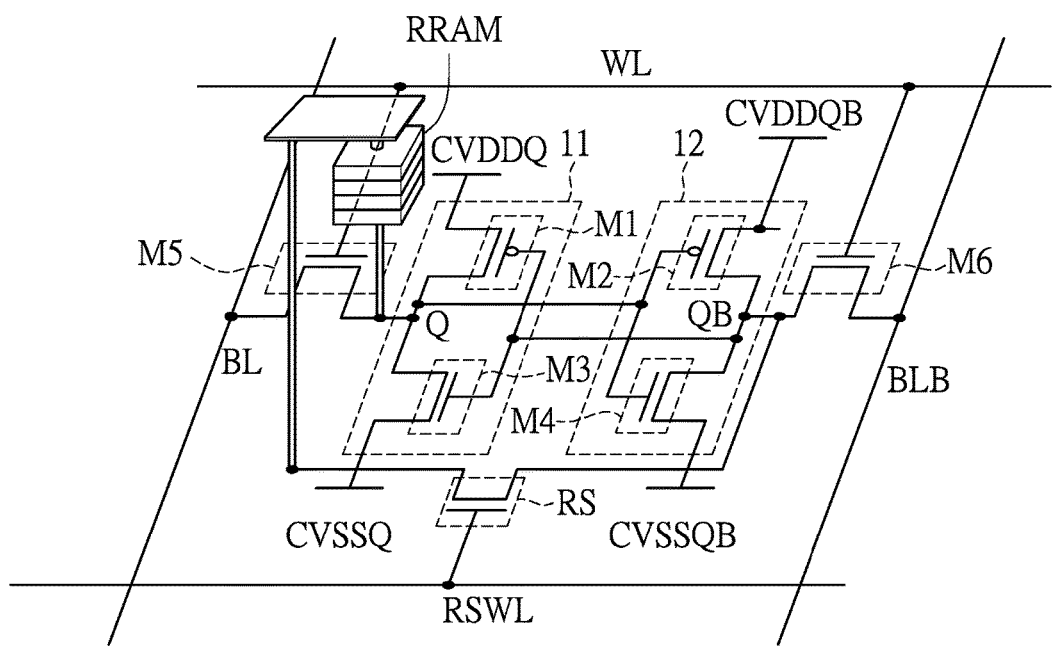
FIG. 7 shows a circuit diagram of a 7T1R non-volatile static random access memory cell according to another embodiment of the instant disclosure.

Please refer to FIG. 7 showing a circuit diagram of a 7T1R SRAM cell according to another embodiment of the instant disclosure. Different from the 7T1R SRAM cell shown in FIG. 4, the variable resistive element RRAM coupling with the third access transistor RS is modified to be coupled between the first output node Q and the second output node QB. The set line RSL is not required. The 7T1R SRAM cell shown in FIG. 7 also can operate in a store operation and a restore operation whose signal diagrams are different from the store operation and the restore operation of the 7T1R SRAM cell shown in FIG. 4.

Figure 8:
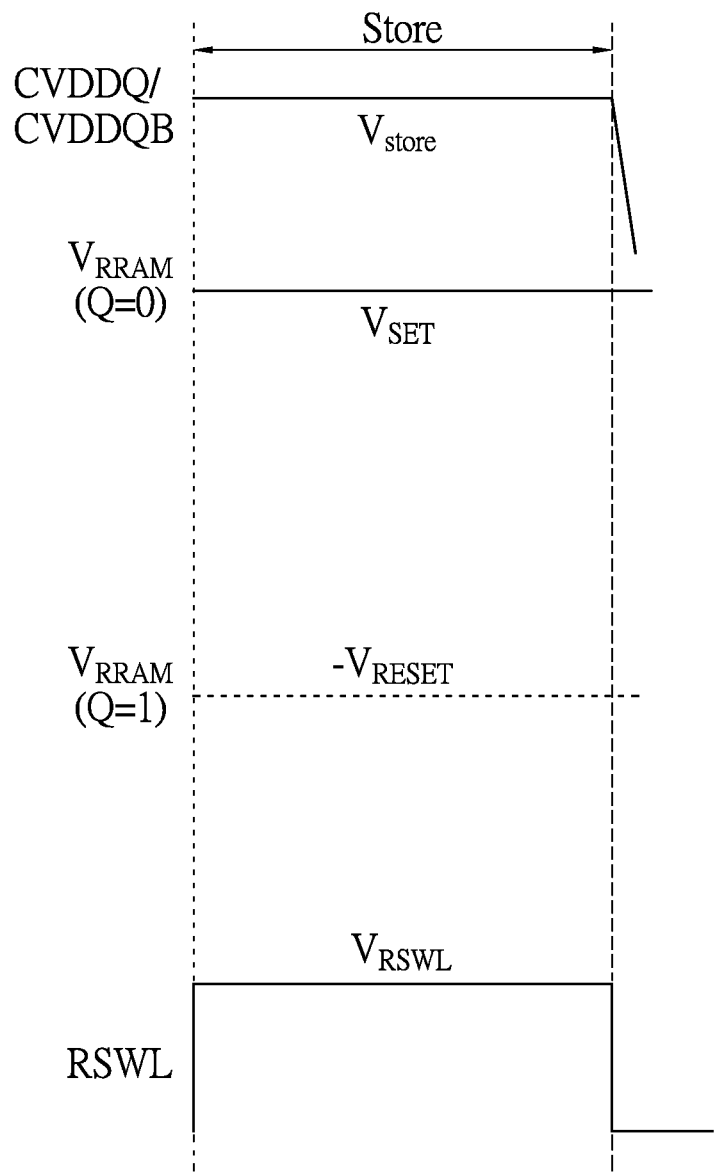
FIG. 8 shows a signal diagram of a store operation of the 7T1R non-volatile static random access memory cell shown in FIG. 7.

When this 7T1R SRAM cell operates in the store operation, the third access transistor RS is turned on (which is the same as the store operation of the 7T1R SRAM cell of FIG. 4). However, the store operation is performed in single clock cycle. Referring to FIG. 8, when the logic value of the first output node Q is "0" and the logic value of the second output node is "1" the variable resistive element RRAM is set to the low resistance state (LRS). That is the low logic state of the 6T SRAM cell is stored to the variable resistance element RRAM.

When the logic value of the first output node is "1" and the logic value of the second output node is "0", the variable resistive element RRAM is set to the high resistance state (HRS). That is, the high logic state of the 6T SRAM cell is stored to the variable resistance element RRAM.

Figure 9:
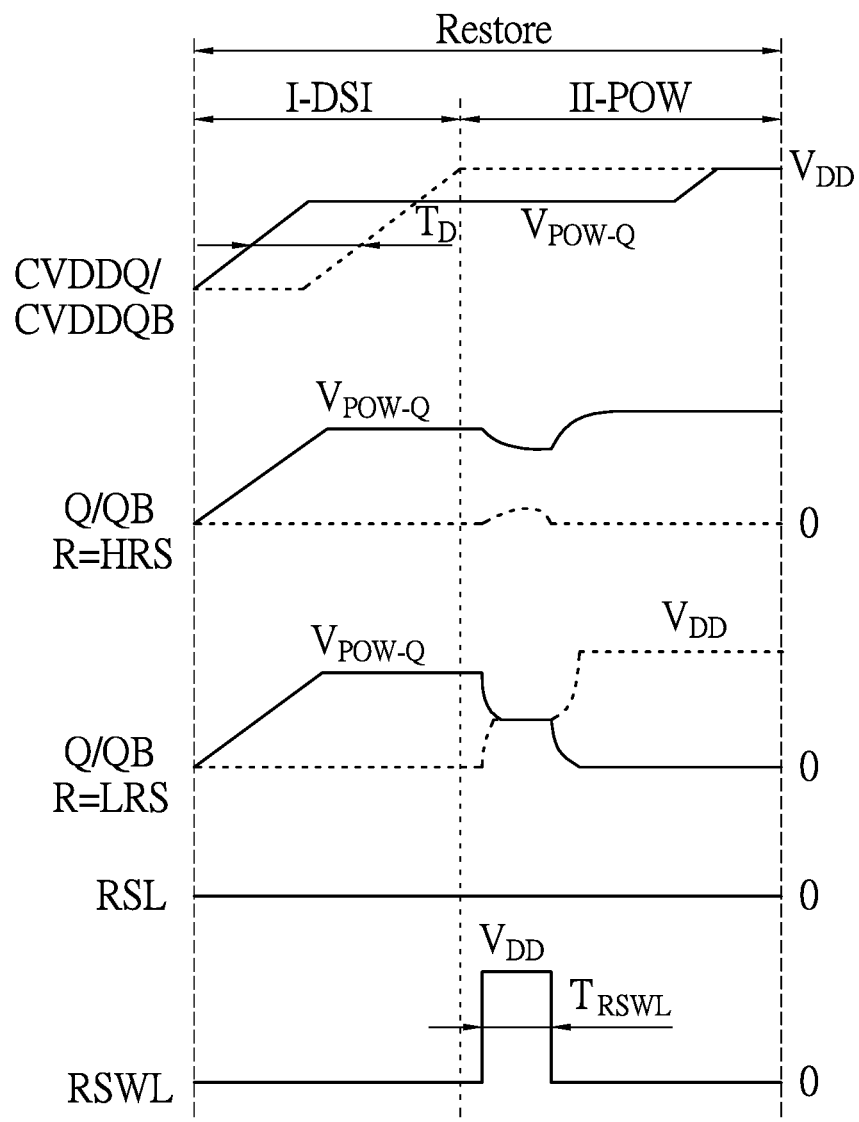
FIG. 9 shows a signal diagram of a restore operation of the 7T1R non-volatile static random access memory cell shown in FIG. 7.

Furthermore, for the restore operation of the 7T1R SRAM cell shown in FIG. 7, the restore operation comprises a first phase and a second phase. The first phase is a dual supply initialization (DSI) phase. The second phase is a pulse-overwrite (POW) phase. Referring to FIG. 9, during the dual supply initialization phase, the first differential supply increases before the second differential supply so as to initialize the first output node as logic "1" and initialize the second output node as logic "0". There are two ways to initialize the first output node as logic "1". When controlling the high-side nodes CVDDQ and CVDDQB, the first high voltage CVDDQ raises (from the ground voltage) before the second high voltage CVDDQB, while the first low voltage CVSSQ is the same as the second low voltage CVSSQB (which is the ground voltage). As shown in FIG. 9, during the dual supply initialization phase, the first high voltage CVDDQ raises while the second high voltage CVDDQB is kept low, in order to initialize the first output node Q to be high logic state ("1"). Then, after a time delay $T_D$, the second high voltage CVDDQB is raised. Thus, the first output node Q stays at logic "1" and the second output node QB is at logic "0". When controlling the low-side nodes CVSSQ and CVSSQB, the second low voltage CVSSQ is pull-down to the ground voltage before the first low voltage CVSS is pull-down to the ground voltage while the first high voltage CVDDQ is the same as the second high voltage CVDDQB ($V_{DD}$). According to any one of the above two ways, the volatile SRAM is initialized to logic "1". As shown in FIG. 9, at the end of the dual supply initialization (DSI) phase the voltage of the first output node Q is at $V_{POW\text{-}Q}$, and the voltage of the second output node QB is at the ground voltage.

Then, during the pulse-overwrite phase, the third access transistor RS is turned on for a switch period $T_{RSWL}$ in order to discharge the first output node Q. The set line RSL is set to low voltage level (ground voltage), such that a current can flow from the first output node Q to the second output node QB. The amount of the current depends on the state of the variable resistive element RRAM. During the pulse-overwrite phase, as shown in FIG. 9, the second high voltage CVDDQB is higher than the first high voltage CVDDQ during the switch period $T_{RSWL}$. The first low voltage CVSSQ and the second low voltage CVSSQB are at the ground voltage. The voltage difference between the second high voltage CVDDQB and the first high voltage CVDDQ is used to overcome the latch state of these two inverters if the resistance of the variable resistive element RRAM is too large. When the third access transistor RS is turned on, if the variable resistive element RRAM is at the high resistance state (HRS) the first output node Q is maintained at logic value "1" (VDD), while the second output node QB is maintained at logic value "0" (ground voltage). A little voltage drop of the first output node Q can be seen in FIG. 9 due to some discharge to the variable resistive element RRAM with large resistance.

Otherwise, if the variable resistive element RRAM is at the low resistance state (LRS) the first output node Q and the second output node QB are conducted together due to turning on of the third access transistor RS, thus the voltage of the first output node Q and the voltage of the second output node QB would be both at a voltage level between logic high and logic low. Then, after the switch period $T_{RSWL}$ the first output node Q is changed to logic value "0", and the second output node QB is changed to logic value "1".

According to above descriptions, the provided 7T1R SRAM cell uses one added transistor (1T) and one added variable resistive element (1R) to a 6T SRAM with differential supplies. The provided 7T1R SRAM cell can reduce store power, increase restore yield, and improve write-margin in SRAM-mode. Furthermore, the provided 7T1R non-volatile SRAM cell can also save energy and save circuit area compared to previous works of the non-volatile SRAM.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:
1. A non-volatile static random access memory cell, comprising:
   a first inverter, having a first input node and a first output node, voltage supplied by a first differential supply, wherein the first inverter comprises:
      a first pull-up transistor having a source terminal coupled to a first high voltage;
      a first pull-down transistor having a source terminal coupled to a first low voltage, the first pull-down transistor having a drain terminal coupled to a drain terminal of the first pull-up transistor to form the first output node, wherein the difference between the first high voltage and the first low voltage is the first differential supply;
   a second inverter, having a second input node and a second output node, voltage supplied by a second differential supply, wherein the first input node is coupled to the second output node, the second input node is coupled to the first output node, wherein the second inverter comprises:
      a second pull-up transistor having a source terminal coupled to a second high supply voltage;
      a second pull-down transistor having a source terminal coupled to a second low voltage supply, the second pull-down transistor having a drain terminal coupled to a drain terminal of the second pull-up transistor to form the second output node, wherein the difference between the second high voltage and the second low voltage is the second differential supply;
   a first access transistor having a gate terminal coupled to a first word line, the first access transistor having a source terminal coupled to the first output node;

a second access transistor having a gate terminal coupled to the first word line, the second access transistor having a source terminal coupled to the second output node; and a variable resistive element coupling with a third access transistor in series, directly coupled between the first output node and the second output node;

wherein the non-volatile static random access memory cell operates in a restore operation comprising a dual supply initialization phase and a pulse-overwrite phase, during the dual supply initialization phase the first high voltage raises before the second high voltage while the first low voltage is the same as the second low voltage and the first output node is initialized as logic "1", during the pulse-overwrite phase the third access transistor is turned on for a switch period in order to discharge the first output node.

2. The non-volatile static random access memory cell according to claim 1, wherein when the non-volatile static random access memory cell operates in a store operation the third access transistor is turned on, when the logic value of the first output node is "0" and the logic value of the second output node is "1" the variable resistive element is set to a low resistance state (LRS), when the logic value of the first output node is "1" and the logic value of the second output node is "0" the variable resistive element is set to a high resistance state (HRS).

3. The non-volatile static random access memory cell according to claim 1, wherein during the pulse-overwrite phase, when the variable resistive element is at a high resistance state (HRS) the first output node is maintained at logic value "1"; wherein during the pulse-overwrite phase, when the variable resistive element is at a low resistance state (LRS) the first output node and the second output node are conducted together due to turning on of the third access transistor, then after the switch period the first output node is changed to logic value "0", and the second output node is changed to logic value "1".

4. The non-volatile static random access memory cell according to claim 1, wherein during the pulse-overwrite phase the first low voltage and the second low voltage are at a ground voltage, the second high voltage is higher than the first high voltage.

5. A non-volatile static random access memory cell, comprising:
a first inverter, having a first input node and a first output node, voltage supplied by a first differential supply, wherein the first inverter comprises:
a first pull-up transistor having a source terminal coupled to a first high voltage;
a first pull-down transistor having a source terminal coupled to a first low voltage, the first pull-down transistor having a drain terminal coupled to a drain terminal of the first pull-up transistor to form the first output node, wherein the difference between the first high voltage and the first low voltage is the first differential supply;
a second inverter, having a second input node and a second output node, voltage supplied by a second differential supply, wherein the first input node is coupled to the second output node, the second input node is coupled to the first output node, wherein the second inverter comprises:
a second pull-up transistor having a source terminal coupled to a second high supply voltage;
a second pull-down transistor having a source terminal coupled to a second low voltage supply, the second pull-down transistor having a drain terminal coupled to a drain terminal of the second pull-up transistor to form the second output node, wherein the difference between the second high voltage and the second low voltage is the second differential supply;

a first access transistor having a gate terminal coupled to a first word line, the first access transistor having a source terminal coupled to the first output node;

a second access transistor having a gate terminal coupled to the first word line, the second access transistor having a source terminal coupled to the second output node; and a variable resistive element coupling with a third access transistor in series, directly coupled between the first output node and the second output node;

wherein the non-volatile static random access memory cell operates in a restore operation comprising a dual supply initialization phase and a pulse-overwrite phase, during the dual supply initialization phase the second low voltage is pull-down to a ground voltage before the first low voltage is pull-down to the ground voltage while the first high voltage is the same as the second high voltage and the first output node is initialized as logic "1", during the pulse-overwrite phase the third access transistor is turned on for a switch period in order to discharge the first output node.

6. A non-volatile static random access memory cell, comprising:
a first inverter, having a first input node and a first output node, voltage supplied by a first differential supply, wherein the first inverter comprises:
a first inverter, having a first input node and a first output node, voltage supplied by a first differential supply, wherein the first inverter comprises:
a first pull-up transistor having a source terminal coupled to a first high voltage;
a first pull-down transistor having a source terminal coupled to a first low voltage, the first pull-down transistor having a drain terminal coupled to a drain terminal of the first pull-up transistor to form the first output node, wherein the difference between the first high voltage and the first low voltage is the first differential supply;
a second inverter, having a second input node and a second output node, voltage supplied by a second differential supply, wherein the first input node is coupled to the second output node, the second input node is coupled to the first output node, wherein the second inverter comprises:
a second pull-up transistor having a source terminal coupled to a second high supply voltage;
a second pull-down transistor having a source terminal coupled to a second low voltage supply, the second pull-down transistor having a drain terminal coupled to a drain terminal of the second pull-up transistor to form the second output node, wherein the difference between the second high voltage and the second low voltage is the second differential supply;

a first access transistor having a gate terminal coupled to a first word line, the first access transistor having a source terminal coupled to the first output node;

a second access transistor having a gate terminal coupled to the first word line, the second access transistor having a source terminal coupled to the second output node; and a variable resistive element coupling with a third access transistor in series, directly coupled between the first output node and the second output node;

wherein the non-volatile static random access memory cell operates in a restore operation comprising a dual supply initialization phase and a pulse-overwrite phase, during the dual supply initialization phase the first high voltage raises after the second high voltage while the first low voltage is the same as the second low voltage and the first output node is initialized as logic "0", during the pulse-overwrite phase the third access transistor is turned on for a switch period in order to charge the first output node.

7. The non-volatile static random access memory cell according to claim 6, wherein when the non-volatile static random access memory cell operates in a store operation the third access transistor is turned on, when the logic value of the first output node is "0" and the logic value of the second output node is "1" the variable resistive element is set to a High resistance state (HRS), when the logic value of the first output node is "1" and the logic value of the second output node is "0" the variable resistive element is set to a low resistance state (LRS).

8. A non-volatile static random access memory cell, comprising:
    a first inverter, having a first input node and a first output node, voltage supplied by a first differential supply, wherein the first inverter comprises:
        a first pull-up transistor having a source terminal coupled to a first high voltage;
        a first pull-down transistor having a source terminal coupled to a first low voltage, the first pull-down transistor having a drain terminal coupled to a drain terminal of the first pull-up transistor to form the first output node, wherein the difference between the first high voltage and the first low voltage is the first differential supply;
    a second inverter, having a second input node and a second output node, voltage supplied by a second differential supply, wherein the first input node is coupled to the second output node, the second input node is coupled to the first output node, wherein the second inverter comprises:
        a second pull-up transistor having a source terminal coupled to a second high supply voltage;
        a second pull-down transistor having a source terminal coupled to a second low voltage supply, the second pull-down transistor having a drain terminal coupled to a drain terminal of the second pull-up transistor to form the second output node, wherein the difference between the second high voltage and the second low voltage is the second differential supply;
    a first access transistor having a gate terminal coupled to a first word line, the first access transistor having a source terminal coupled to the first output node;
    a second access transistor having a gate terminal coupled to the first word line, the second access transistor having a source terminal coupled to the second output node; and
    a variable resistive element coupling with a third access transistor in series, directly coupled between the first output node and the second output node;
    wherein the non-volatile static random access memory cell operates in a restore operation comprising a dual supply initialization phase and a pulse-overwrite phase, during the dual supply initialization phase the second low voltage is pull-down to a ground voltage after the first low voltage is pull-down to the ground voltage while the first high voltage is the same as the second high voltage and the first output node is initialized as logic "0", during the pulse-overwrite phase the third access transistor is turned on for a switch period in order to charge the first output node.

\* \* \* \* \*